United States Patent [19]

Henry

[11] 4,296,374

[45] Oct. 20, 1981

[54] WIDEBAND DIGITAL SPECTROMETER

[75] Inventor: Paul S. Henry, Holmdel, N.J.

[73] Assignee: Bell Telephone Laboratories, Incorporated, Murray Hill, N.J.

[21] Appl. No.: 83,596

[22] Filed: Oct. 11, 1979

[51] Int. Cl.³ .................................... G01R 23/16
[52] U.S. Cl. .............................. 324/77 B; 324/77 R
[58] Field of Search .............. 324/77 R, 77 B, 77 E, 324/77 G, 77 C, 78 D

[56] References Cited

U.S. PATENT DOCUMENTS

| 3,581,199 | 5/1971 | Spitz | 324/77 R |
| 3,708,746 | 1/1973 | Willett | 324/77 R |
| 3,903,401 | 9/1975 | Jayant | 324/77 B |
| 4,057,756 | 11/1977 | Leg | 324/77 B |

OTHER PUBLICATIONS

J. E. Gibbs, et al., "Applications of Walsh Functions to Transform Spectroscopy", Nature, Vol. 224, 12/6/69, pp. 1012–1013.
H. A. Gebbie, "Walsh Functions and the Experimental Spectroscopist", 1970 Proceedings, Applications of Walsh Functions, Washington, DC, 1970, p. 99.
J. Granlund, "An Application of Walsh Functions in Radio Astronomy Instrumentation," IEEE Trans on Electromagnetic Compatibility, Aug. 1978, pp. 451–453.
C. Pelle et al. "A High Speed Digital Autocorrelation Spectrometer for Millimeter Astronomy", Journal of Physics, E. vol. 8, No. 9, 1975, pp. 786–789.
J. G. Ables et al. "A 1024-Channel Digital Correlator," Rev. Sci. Instrum, vol. 46, No. 3, pp. 284–295.
H. F. Harmuth, "Applications of Walsh Functions in Communications," IEEE Spectrum, vol. 6, Nov. 1969, pp. 82–91.

Primary Examiner—Michael J. Tokar
Attorney, Agent, or Firm—Erwin W. Pfeifle

[57] ABSTRACT

The present invention relates to a wideband digital spectrometer capable of obtaining the Fourier power spectrum of a combination of an input signal, using the Walsh functions. The input signal is low-pass filtered (10) at a cutoff frequency $f_c$, then sampled at a rate of $2f_c$ (12) to provide N sequences representative of the digitized input signal. Each one of the N sequences is combined with a separate one of the N Walsh functions (14), and the Walsh power spectrum of each one of these N combinations is then computed (16). These N Walsh power spectrum components are applied to an $N \times N$ Walsh-Fourier power transformer (18) which generates the desired N Fourier power spectrum components.

5 Claims, 3 Drawing Figures

N-CHANNEL WALSH FUNCTION SPECTROMETER

WALSH FUNCTIONS
(PRIOR ART)

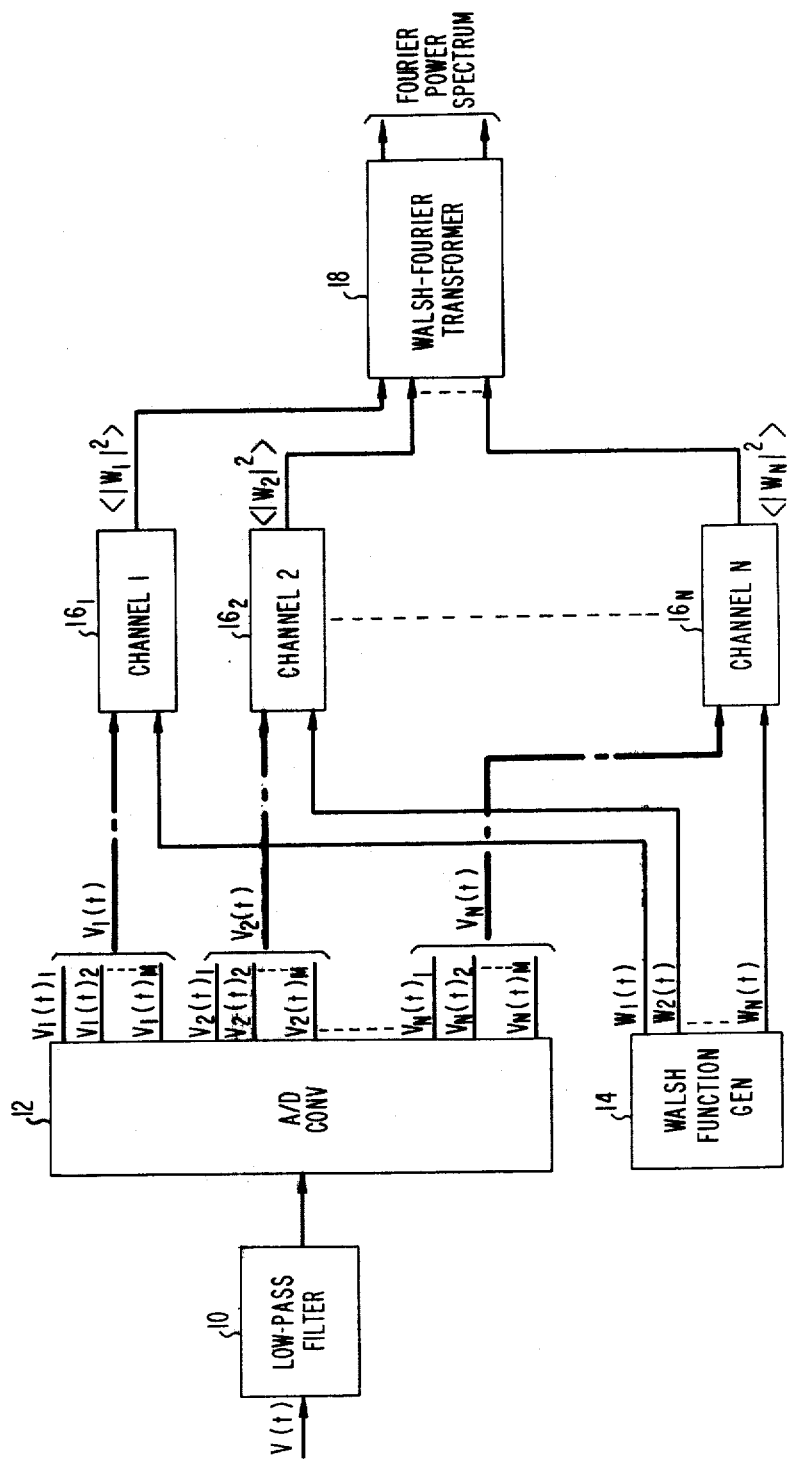

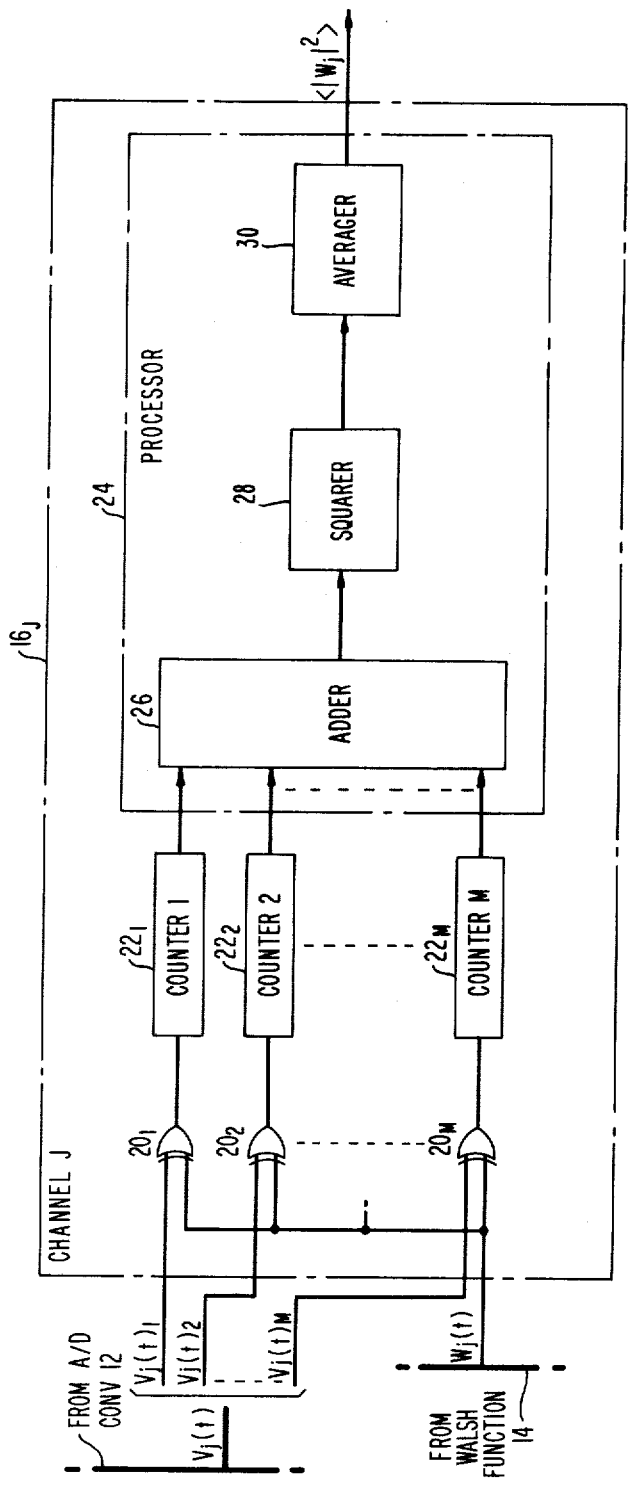

WIDEBAND DIGITAL SPECTROMETER

BACKGROUND OF THE INVENTION

1. Technical Field

This invention relates to a device for performing wideband digital spectrometry, and more particularly, to a wideband digital spectrometer including circuitry that functions to utilize the inherent properties of the Walsh functions which take on only values of +1 or −1, in combination with a Walsh Fourier transform of power components obtained from the known Walsh Fourier amplitude transform, to achieve a simplified method of producing the Fourier power spectrum of an input signal.

2. Description of the Prior Art

In the past, two methods have been used to obtain the power spectrum of radio astronomy signals. The analog signal itself was often directly Fourier transformed to obtain the power spectrum desired, and more recently, the analog signal was converted to digital form and an autocorrelation performed on this digital representation to obtain the desired power spectrum.

In the analog method, the input signal is fed into a bank of bandpass filters with specified center frequencies and narrow bandwidths. These high Q filters are extremely difficult to manufacture and their accuracy is often restricted by the physical limitations of the filter components. To obtain the Fourier transform, each filter has to be followed by a rectifier and integrating device. If the filter bandwidth and integrator gains are not stable, the filter bank has to be continuously calibrated. The filter spacings and bandwidths cannot be readily changed, hence, the frequency resolution of the system is fixed upon construction.

The digital correlation techniques make use of the well-known Weiner-Khintchine theorem, which states that the power spectrum of a signal is the Fourier transformation of its autocorrelation function. One example of such a technique is discussed in "A 1024-Channel Digital Correlator" by J. G. Ables et al in *Review of Scientific Instruments*, Vol. 46, No. 3, March 1975 pp. 284-95. In this case, the correlator is built in four quadrants, allowing it to be used as four independent 256-channel correlators, two 512-channel correlators or one 1024-channel correlator when high resolution is required. The correlator is connected on-line to a computer, which obtains the Fourier spectrum in real time. This method, however, is limited, physically, to slow sampling rates, even when using the fast Fourier transform, due to the number of multiplications involved.

A higher sampling rate has been achieved in another autocorrelator, the construction of which is discussed in the article "A High Speed Digital Autocorrelation Spectrometer for Millimeter Astronomy" by C. Pell and L. T. Little in *Journal of Physics E*, Vol. 8, No. 9, 1975, pp. 786-789. In C. Pell et al, the sampling rate has been increased from 20 MHz for the Ables et al design to 60 MHz. This increase is achieved by using Schottky clamped TTLs in the computer. This technique, however, is still limited by the number of fast Fourier transform multiplications that must be performed.

Knowledge of the relationship between Walsh functions and Fourier functions is well represented in the prior art. One article, "Applications of Walsh Functions in Communications" by Henning F. Harmuth in *IEEE Spectrum*, November 1969, pp. 82-91 discusses the general application possibilities of Walsh functions, and more specifically, the advantages of Walsh-based digital filters.

Another article, "Application of Walsh Functions to Transform Spectroscopy" by J. E. Gibbs and H. A. Gebbie in *Nature*, Vol. 224, 1969, pp. 1012-1013, narrows the application of Walsh functions to the field of spectrometry without, however, discussing any specific means for actual implementation of the Walsh functions.

The problem remaining in the prior art is to provide a means for utilizing the Walsh function capabilities in conjunction with the preexisting techniques of digital spectrometry, to obtain a more efficient digital spectrometer.

SUMMARY OF THE INVENTION

The problem remaining in the prior art has been solved in accordance with the present invention, which relates to a device for performing wideband digital spectrometry, and more particularly, to a wideband digital spectrometer including circuitry that functions to utilize the inherent properties of the Walsh functions, which may take on only values of +1 or −1, in combination with a Walsh-Fourier transform of power components obtained from the known Walsh-Fourier amplitude transform, to achieve a simplified method of producing the Fourier power spectrum of an input signal.

In the present device, an input signal is low-pass filtered at a cutoff frequency $f_c$, then sampled at a rate of $2f_c$ and fanned out to provide N identical sequences representative of the digitized input signal. Each one of the N identical sequences is combined with a separate one of N distinct Walsh Functions, and the Walsh power spectrum component of each one of these N combinations is then computed. These N Walsh power spectrum components are applied to an N×N Walsh-Fourier power transformer which generates the desired N Fourier power spectrum components from these N Walsh power spectrum components.

Other aspects of the present invention will become apparent during the course of the following description and by reference to the accompanying drawings.

BRIEF DESCRIPTION OF THE DRAWINGS

Referring now to the drawings, in which like numerals represent like parts in several views:

FIG. 2 is a block diagram of an N-channel Walsh Function Spectrometer in accordance with the present invention;

FIG. 3 is a block diagram of a single channel of the N-channel Walsh Function Spectrometer of FIG. 2 in accordance with the present invention.

DETAILED DESCRIPTION

Figure 1:
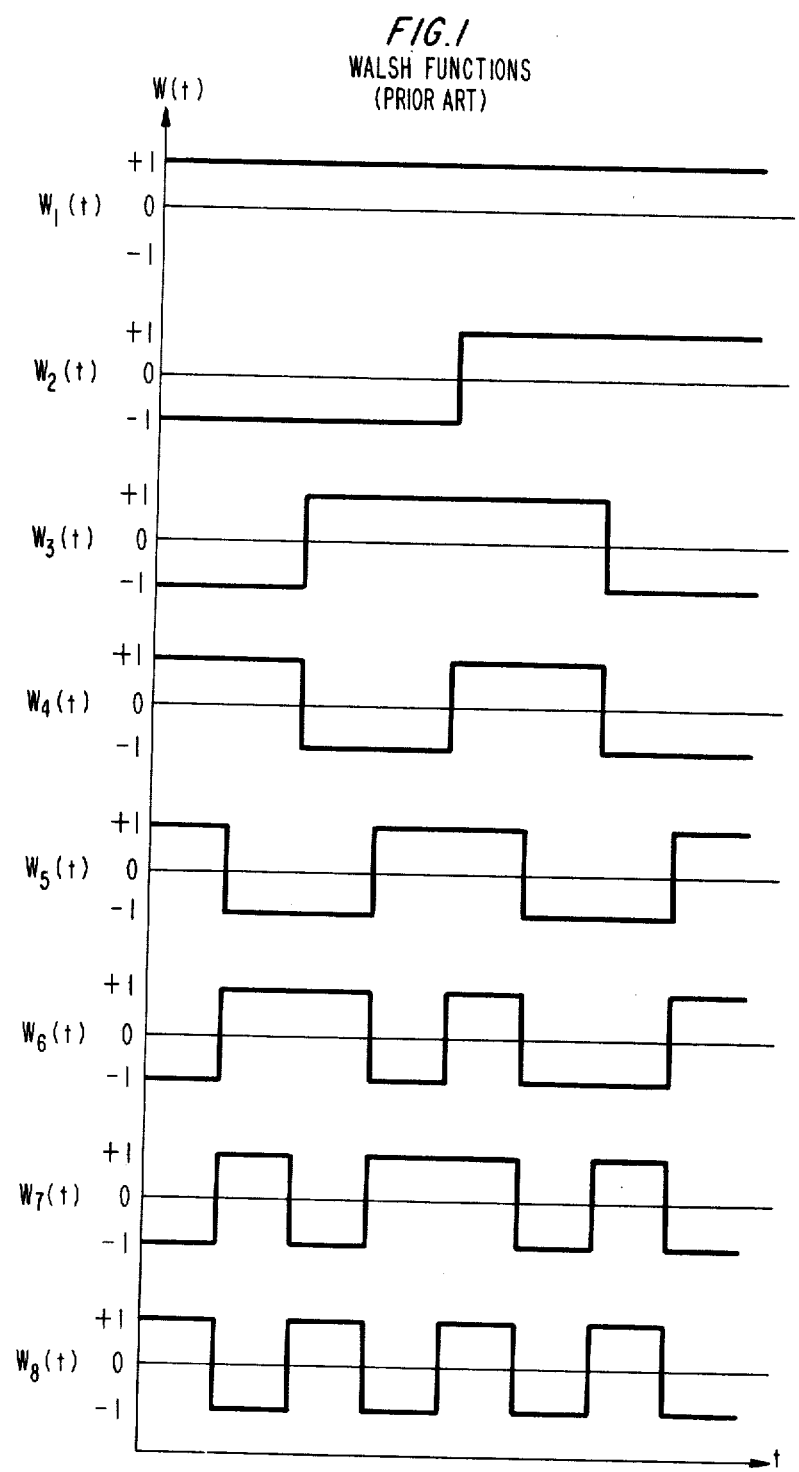
FIG. 1 shows the Walsh functions as a function of time for an eight element sequence.

FIG. 1 is an illustration of the well-known Walsh functions for N=8. These functions are generated by the formula:

$$w_n(t) = \text{sign}\left[ \sin (2\pi t)^{b_0} \prod_{h=1}^{m} \cos(2^h \pi t)^{b_h} \right] \quad (1)$$

where $n = b_m 2^m + b_{m-1} 2^{m-1} + \ldots + b_1 2^1 + b_0$, $b_i = 0$ or 1.

FIG. 2 is a block diagram of an N-channel Walsh function spectrometer in accordance with the present invention. An input signal, v(t) is fed into a low-pass filter 10 and in turn through an analog-to-digital converter 12 having M bits of resolution to generate N separate identical output sequences. $v_1(t), v_2(t), \ldots, v_N(t)$, each sample $v_j$ being an M-bit digital "word". Both filter 10 and converter 12 are well-known in the art, and any such suitable circuits may be employed in the present invention.

A Walsh function generator 14 is used to generate as an output on separate leads, N separate and distinct Walsh function sequences $w_1(t), w_2(t), \ldots, w_N(t)$. Walsh function generators are well-known in the art, and any such suitable device, such as the Harmuth array generator shown in FIG. 2.4 of K. G. Beauchamp's *Walsh Functions and Their Applications*, New York: Academic Press, 1975, may be employed in the present invention.

Each one of the N separate but identical outputs of converter 12 is paired with a corresponding one of the N separate and distinct outputs of generator 14. For example, $v_1(t)$ is paired with $w_1(t), v_2(t)$ is paired with $w_2(t)$, and so on such that $v_N(t)$ is paired with $w_N(t)$, each pair being used as an input pair to a separate one of N channels $16_1-16_N$. For example, $v_1(t)$ and $w_1(t)$ are fed into channel $16_1, v_2(t)$ and $w_2(t)$ are fed into channel $16_2$, likewise for each successive channel, with $v_N(t)$ and $w_N(t)$ being fed into channel $16_N$. The N channels $16_1-16_N$ are used to compute the N averaged Walsh power spectrum components $<|w_1|^2>, <|w_2|^2>, \ldots, <|w_N|^2>$, respectively, where $<|w_1|^2>$ is the averaged Walsh power spectrum component computed from $v_1(t)$ and $w_1(t)$, $<|w_2|^2>$ is the averaged Walsh power spectrum component computed from $v_2(t)$ and $w_2(t)$, continuing in a like manner for each separate channel, so that for the Nth channel $<|w_N|^2>$ is the averaged Walsh power spectrum component computed from $v_N(t)$ and $w_N(t)$. A detailed description of one of the abovementioned channels is provided hereinafter with FIG. 3.

The N averaged Walsh power spectrum components obtained from channels $16_1-16_N$ are applied as inputs to a Walsh-Fourier power transformer 18 which generates therefrom N Fourier power spectrum components as an output. In operation, transformer 18 performs a matrix multiplication of an N×N matrix T, where T is the inverse of the N×N matrix consisting of the Fourier power coefficients of the Walsh functions, the power coefficients being the square of the Fourier amplitudes of the Walsh functions, and the N×1 matrix of the Walsh power spectrum obtained from the N channels $16_1-16_N$, $[<|w_1|^2>, <|w_2|^2>, \ldots, <|w_N|^2>]$, to produce the N×1 matrix of the desired Fourier power spectrum components.

FIG. 3 illustrates an exemplary channel, $16_j$, of the N channels $16_1-16_N$ described hereinabove in association with FIG. 2. The input $v_j(t)$ to channel $16_j$ denotes the $j^{th}$ sequence of the sampled input signal from converter 12, as described hereinabove in association with FIG. 2. Associated with this $j^{th}$ sequence $v_j(t)$ is the input $j^{th}$ Walsh function $w_j(t)$, generated by Walsh function generator 14 as described hereinabove in association with FIG. 2. Both input signals $v_j(t)$ and $w_j(t)$ are digital sequences, each sample of $v_j$ is M bits in length. Each bit of the M bits of $v_j(t)$ is paired in a one-to-one manner with the respective value of $w_j(t)$. For example, $v_j(t)_1$ is paired with $w_j(t), v_j(t)_2$ is paired with $w_j(t)$, and so on such that $v_j(t)_M$ is paired with $w_j(t)$, each pair appearing on a separate lead.

Each pair of the M pairs of $v_j(t)$ and $w_j(t)$ components is applied as an input pair to a separate one of a set of M exclusive-OR gates $20_1-20_M$, where the set of M exclusive-OR gates function so as to perform a modulo-2 multiplication of $v_j(t)$ and $w_j(t)$. For example, $v_j(t)_1$ and $w_j(t)$ are applied as separate inputs of exclusive-OR gate $20_1, v_j(t)_2$ and $w_j(t)$ are applied as separate inputs of exclusive-OR gate $20_2$, likewise for each successive pair of inputs, with $v_j(t)_M$ and $w_j(t)$ being applied as separate inputs of exclusive-OR gate $20_M$, where $v_j(t)_1$ is the most significant bit of $v_j(t)$ and $v_j(t)_M$ is the least significant bit of $v_j(t)$.

The output of each separate exclusive-OR gate 20 is applied to the input of one of counters $22_1-22_M$, such that the output of exclusive-OR gate $20_1$ is fed into counter $22_1$, the output of exclusive-OR gate $20_2$ is fed into counter $22_2$, and continuing in a like manner so that the output of exclusive-OR gate $20_M$ is fed into counter $22_M$. Both exclusive-OR gates $20_1-20_M$ and counters $22_1-22_M$ are well-known in the art, and any such suitable circuits may be employed in the present invention.

The counters $22_1-22_M$ are fed the outputs of the exclusive-OR gates $20_1-20_M$ for a period $\tau = N/2f_c$, where N is the total number of samples of the input signal to the N-channel Walsh function spectrometer and $f_c$ is the cutoff frequency of filter 10. At the end of period $\tau$ the M outputs of the M counters $22_1-22_M$ are applied to processor 24 which computes the average Walsh power spectrum component referred to hereinabove in association with FIG. 2.

Processor 24 comprises three components, an adder 26, a squarer 28, and an averager 30. The M outputs of counters $22_1-22_M$ are applied simultaneously to separate inputs of adder 26, adder 26 functioning to sum the appropriately weighted input signal values and generate as an output a single binary resultant number $W_j$. This output signal of adder 26, $W_j$, is applied as an input signal to squarer 28, squarer 28 generating as an output the absolute-squared value of the input to squarer 28, this output being denoted $|W_j|^2$. Both adder 26 and squarer 28 are well-known in the art, and any such suitable circuits may be used in accordance with the present invention.

The output of squarer 28, $|W_j|^2$, is used as an input to averager 30. Averager 30 stores the value of $|W_j|^2$ averaged over many previous $\tau$ intervals and averages it with the present value of $|W_j|^2$ just computed by squarer 28. This updated average is then held in a memory (not shown) and averaged with the value of $|W_j|^2$ obtained from squarer 28 in the subsequent time interval $\tau$. Averager 30 is well-known in the art, and any such suitable circuit may be employed in the present invention. This process of averaging continues until the noise component of the averaged value is reduced to a predetermined acceptable level. The averaged value once reduced to the predetermined acceptable noise level, is then applied as an output from averager 30 to a utilization circuit (not shown), and is denoted as the averaged Walsh power spectrum component $<|W_j|^2>$, as referred to hereinabove in association with FIG. 2.

It is to be understood that the above-described embodiments are simply illustrative of the principle of the invention. Various other modifications and changes may be made by those skilled in the art which will embody the principles of the invention and fall within the spirit and scope thereof.

I claim:

1. A wideband digital spectrometer comprising:

low-pass filtering means (10) for low-pass filtering an input signal;

means (12) connected to the output of said filtering means capable of converting an analog signal to a plurality of N digital signals, each digital signal having M bits of resolution;

Walsh function generating means (14) for generating a plurality of N Walsh functions, each Walsh function being either $+1$ or $-1$;

means (18) capable of performing an $N \times N$ Walsh-Fourier power transformation characterized in that the wideband digital spectrometer further comprises power spectrum generating means (16) connected to both the output of the analog-to-digital converting means (12) and the output of the Walsh function generating means (14) and capable of generating as an output a signal representative of a Walsh power spectrum of said analog-to-digital converting means, the output of said power spectrum generating means being connected to the input of the Walsh-Fourier power transformation means.

2. A wideband digital spectrometer in accordance with claim 1 characterized in that the power spectrum generating means further comprises a plurality of N separate channels ($16_1-16_N$), each channel comprising a first input coupled to receive a separate one of the N identical digital signals and a second input coupled to receive a separate corresponding one of the N distinct Walsh functions, and capable of generating a signal representative of the Walsh power spectrum of the analog-to-digital converting means associated therewith.

3. A wideband digital spectrometer in accordance with claim 1 or 2 characterized in that the power spectrum generating means comprises a plurality of N separate channels ($16_1-16_N$) each channel receiving both a separate one of the N,M-bit, identical digital signals from the analog-to-digital converting means and a corresponding separate one of the N distinct Walsh functions generated by the Walsh function generating means and comprising:

means (20,22) capable of multiplying together corresponding bits of said received M-bit digital signal and said received Walsh function to generate a time dependent product thereof; and processing means (24) comprising a plurality of M inputs, each input coupled with a separate one of the M outputs of said multiplying means, capable of generating at an output thereof a signal representative of the average Walsh power spectrum of the input to said analog-to-digital converting means.

4. A wideband digital spectrometer in accordance with claim 3 characterized in that the multiplying means comprises:

a plurality of M exclusive-OR gates ($20_1-20_M$), each gate comprising a first input coupled to receive a separate bit of the associated M-bit digital signal and a second input coupled to receive the associated Walsh function, with gate $20_1$ coupled to receive the most significant bit of the M-bit digital signal and gate $20_M$ coupled to receive the least significant bit of the M-bit digital signal, and capable of generating therefrom an exclusive-OR function for each gate of said plurality of M exclusive-OR gates; and a plurality of M counters ($22_1-22_M$), each counter comprising an input coupled to receive a separate one of M outputs from said plurality of M exclusive-OR gates and capable of generating as an output the accumulated value of the output of the exclusive-OR gate associated therewith.

5. A wideband digital spectrometer in accordance with claim 3 characterized in that the processing means comprises:

means (26) capable of performing an M-bit addition of a set of signals present at the plurality of M inputs to the processing means and generating a weighted sum of said plurality of M inputs;

means (28) connected to the output of said adding means and capable of squaring an input signal to generate as an output a signal representative of the square of said input signal applied thereto; and means (30) connected to the output of said squaring means capable of both storing an input value of a signal received from said squaring means in an immediately previous time period and averaging the received input signal in a present time period with a previously computed average value to generate at the output thereof a signal representative of the average Walsh power spectrum of the input to the multiplying means.

* * * * *